United States Patent
Berg et al.

(10) Patent No.: US 11,527,668 B2
(45) Date of Patent: Dec. 13, 2022

(54) STACKED MONOLITHIC MULTI-JUNCTION SOLAR CELL

(71) Applicant: AZUR SPACE Solar Power GmbH, Heilbronn (DE)

(72) Inventors: Alexander Berg, Heilbronn (DE); Matthias Meusel, Heilbronn (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 0 days.

(21) Appl. No.: 17/468,249

(22) Filed: Sep. 7, 2021

(65) Prior Publication Data

US 2022/0077343 A1 Mar. 10, 2022

(30) Foreign Application Priority Data

Sep. 7, 2020 (EP) .................................... 20000323

(51) Int. Cl.
*H01L 31/0725* (2012.01)
*H01L 31/054* (2014.01)

(52) U.S. Cl.
CPC ...... *H01L 31/0725* (2013.01); *H01L 31/0547* (2014.12)

(58) Field of Classification Search
CPC .............. H01L 31/0543; H01L 31/0547; H01L 31/0687; H01L 31/06875; H01L 31/0725;

(Continued)

(56) References Cited

U.S. PATENT DOCUMENTS 6,660,928 B1 12/2003 Patton et al.
8,716,593 B2 5/2014 Meusel et al.
(Continued)

FOREIGN PATENT DOCUMENTS

CN 106024924 A * 10/2016 ....... H01L 31/03048
CN 107871799 A 4/2018
(Continued)

OTHER PUBLICATIONS

Machine translation of CN-106024924-A, Liu J et al. (Year: 2016).*
(Continued)

*Primary Examiner* — Mayla Gonzalez Ramos
(74) *Attorney, Agent, or Firm* — Muncy, Geissler, Olds & Lowe, P.C.

(57) ABSTRACT

A stacked monolithic multi-junction solar cell having at least four subcells, wherein the band gap increases starting from the first subcell in the direction of the fourth subcell, each subcell has an n-doped emitter and a p-doped base, the emitter and the base of the first subcell each are formed of germanium, all following subcells each have at least one element of main group III and V of the periodic table, all subcells following the first subcell are formed lattice-matched to one another, a semiconductor mirror having a plurality of doped semiconductor layers with alternately different refractive indices is placed between the first and second subcell, the semiconductor layers of the semiconductor mirror are each formed n-doped and each have a dopant concentration of at most $5 \cdot 10^{18}$ cm$^{-3}$, the semiconductor mirror is placed between the first subcell and the first tunnel diode.

16 Claims, 1 Drawing Sheet

(58) Field of Classification Search
CPC . H01L 31/0735; H01L 31/18; H01L 31/1844; H01L 31/1892
See application file for complete search history.

(56) References Cited

U.S. PATENT DOCUMENTS

| | | | |
|---|---|---|---|
| 10,985,288 | B2 | 4/2021 | Meusel et al. |
| 10,991,840 | B2 | 4/2021 | Ebel et al. |
| 2016/0133775 | A1* | 5/2016 | Fuhrmann ............. H01L 31/056 136/246 |
| 2017/0186904 | A1 | 6/2017 | Guter et al. |
| 2019/0013429 | A1* | 1/2019 | Suarez ................. H01L 31/1848 |
| 2020/0027999 | A1 | 1/2020 | Derkacs et al. |
| 2020/0203537 | A1* | 6/2020 | Derkacs ............ H01L 31/02008 |
| 2020/0251603 | A1 | 8/2020 | McGlynn et al. |

FOREIGN PATENT DOCUMENTS

| | | | | |
|---|---|---|---|---|
| CN | 209045576 | U * | 6/2019 | ....... H01L 31/03048 |
| DE | 102005000767 | A1 | 7/2006 | |
| DE | 102014210753 | A1 | 12/2015 | |
| DE | 102015016047 | A1 | 6/2017 | |
| DE | 102015016822 | A1 | 6/2017 | |
| EP | 2251912 | A1 | 11/2010 | |

OTHER PUBLICATIONS

Machine translation of CN-209045576-U, Gao X et al. (Year: 2019).*
W. Guter et al: "Space Solar Cells—3G30 and Next Generation Radiation Hard Products" E3S Web of Conferences 16, 2017, pp. 03005-1-03005-6, DOI: 10.1051/e3sconf/20171603005.
Steven Wojtczuk: "Bifacial growth InGaP/GaAs/InGaAs concentrator solar cells" IEEE Journal of Photovoltaics, Jul. 2012, vol. 2, No. 3, DOI: 10.1109/JPHOTOV.2012.2189369.
Rao Tatavarti: "InGaP/ GaAs/ InGaAs Inverted Metamorphic (IMM) Solar Cells on 4" Epitaxial Lifted Off (ELO) Wafers" IEEE, 2010, pp. 2125-2128.
Andreas W. Bett et al: "Highest Efficiency multi-junction solar cell for terrestrial and space applications" 24$^{th}$ European Photovoltaic Solar Energy Conference, Sep. 21-25, 2009, pp. 1-6.
Jan Schoene: "Control of Strain Relaxation and Defect Formation in Metamorphic III-V Semiconductor Heterostructures for High-Efficiency Solar Cells" 2009.
U.S. Appl. No. 17/468,367, filed Sep. 7, 2021.

* cited by examiner

STACKED MONOLITHIC MULTI-JUNCTION SOLAR CELL

This nonprovisional application claims priority under 35 U.S.C. § 119(a) to European Patent Application No. 20000323.4, which was filed in Europe on Sep. 7, 2020, and which is herein incorporated by reference.

BACKGROUND OF THE INVENTION

Field of the Invention

The present invention relates to he invention relates to a stacked multi-junction solar cell.

Description of the Background Art

A stacked monolithic multi-junction solar cell is known, for example, from DE 10 2005 000 767 A1, which corresponds to U.S. Pat. No. 10,985,288. The multi-junction solar cell comprises a first germanium subcell as well as at least two further subcells and at least one semiconductor mirror, wherein the semiconductor mirror has a plurality of layers with refractive indices that at least differ from one another and a high degree of reflection in at least one part of the absorption range of the subcell or subcells placed thereabove and a high transmission degree for radiation in the spectral absorption range of the subcells placed underneath the semiconductor mirror.

DE 10 2015 016 047 A1, which corresponds to U.S. Pat. No. 10,991,840, which is herein incorporated by reference, discloses a stacked monolithic III-V multi-junction solar cell having a first germanium subcell and a following second subcell containing indium and phosphorus. If the first and second subcells have different lattice constants, the multi-junction solar cell thus comprises a metamorphic buffer placed between the first and second subcells.

A similar multi-junction solar cell is known from DE 10 2015 016 822 A1, which corresponds to US 2017/0186904, which is incorporated herein by reference.

A stacked metamorphic multi-junction solar cell is known from EP 2 251 912 A1, wherein the tunnel diodes placed between the subcells each have a compressively strained first layer and a tensile strained second layer, so that each tunnel diode as a whole is made to be strain-compensated.

SUMMARY OF THE INVENTION

It is therefore an object of the present invention to provide a device that advances the state of the art.

In an exemplary embodiment, a stacked monolithic multi-junction solar cell is provided that includes a first subcell, a second subcell, a third subcell, and at least one fourth subcell one after the other in the order mentioned, wherein the band gap increases from subcell to subcell starting from the first subcell in the direction of the fourth subcell.

Each subcell has an n-doped emitter and a p-doped base, wherein the emitter and the base of the first subcell each have germanium or consist of germanium and all subcells following the first subcell each have at least one element of main group III of the periodic table and an element of main group V of the periodic table.

A tunnel diode with a p-n junction is placed between two subcells in each case.

All subcells following the first subcell are formed lattice-matched to one another.

A semiconductor mirror having a plurality of n-doped semiconductor layers with alternately different refractive indices is placed between the first subcell and the following second subcell.

An n-doped metamorphic buffer is placed between the first subcell and the semiconductor mirror, wherein the metamorphic buffer has at least four step layers and at least one overshoot layer.

A first tunnel diode is formed between the n-doped semiconductor mirror and the second subcell, wherein the first tunnel diode is formed metamorphic.

The n-doped layer of the metamorphic tunnel diode consists of InGaAs or comprises InGaAs.

The proportion of In based on the proportion of group III elements in the III-V compound of the n-doped layer of the metamorphic tunnel diode is at least 20%. Preferably, the n-doped layer is doped with tellurium.

It should be noted that in the case of a metamorphic tunnel diode, the n-doped layer has a slightly different lattice constant than the overlying second subcell and/or the n-doped layer has a slightly different lattice constant than the p-doped layer of the first tunnel diode. The difference between the lattice constants is preferably greater than 0.1% or greater than 0.3% and less than 10% or less than 5% or less than 3% or less than 2%.

A tunnel diode can be placed in each case between two successive subcells.

In an example, at least two of the buffer layers can have a doping less than $8 \cdot 10^{17}$ cm$^{-3}$.

It should be noted that the III-V subcells and further layers of the stacked multi-junction solar cell can be epitaxially grown one after the other on the Ge subcell, for example, on a Ge substrate.

It should be noted further that the term 'overshoot layer' can denote a layer of the metamorphic buffer that has a larger lattice constant than the lattice constant of the first subcell and a larger lattice constant than the lattice constant of the second subcell or the following subcells.

In the present case, the solar cell is an upright metamorphic multi-junction solar cell, a so-called UMM solar cell arrangement, without a semiconductor bond or wafer bond. Stated differently, all subcells of the multi-junction cell are grown one after the other epitaxially one on top of the other in a MOVPE system and are not assembled from two substacks.

The first subcell has the smallest band gap and the fourth subcell, in a total of four subcells, the largest band gap. If there are more than four subcells, the top subcell accordingly has the largest band gap.

All subcells can be formed with an n-over-p structure and consequently have an n-doped emitter over a p-doped base.

In contrast to the usual arrangement of the semiconductor mirror directly below a subcell, e.g., directly below the second subcell, in the present case the semiconductor mirror is placed below the first tunnel diode. In addition, in contrast to the usual p-doped design, the semiconductor mirror is formed n-doped.

In addition, the tellurium n-doped layer of the first tunnel diode has InGaAs, as a result of which the layer or tunnel diode, compared to, e.g., an n-InAlP layer, becomes reliably stable with respect to the thermal load during the subsequent further growth of the further subcells.

It is surprising that the efficiency of the multi-junction solar cell increases with a reduction in the doping in the layers of an n-doped metamorphic buffer below a value of $1 \cdot 10^{18}$ cm$^{-3}$.

So far it has been assumed that it is advantageous for the conductivity to select the doping of the buffer layers in a range above $1 \cdot 10^{18}$ cm$^{-3}$.

Furthermore, in order to increase the radiation stability of a subcell for a given subcell thickness, the semiconductor mirror is usually placed directly below the relevant subcell, i.e., directly below the p-doped base of a subcell, and is therefore also made p-doped.

It is understood that a semiconductor mirror can have a plurality of periods made of thin layers, wherein the thin layers alternately have a low and a high refractive index.

A period can comprise at least two or three layers, wherein the semiconductor mirror comprises at least 10 layers, i.e., at least 5 periods. In one refinement, the semiconductor mirror comprises at least 10 or at least 15 periods.

In contrast to this, a tunnel diode is placed between the semiconductor mirror and the subcell above it, therefore, the second subcell, so that the semiconductor mirror is formed n-doped.

Surprisingly, it was found that when the tunnel diode is placed between the p-doped base and the semiconductor mirror, the semiconductor mirror has a significantly higher transmission in relation to the subcells below it with an unchanged good reflection behavior and the efficiency of the multi-junction cell can be increased.

The arrangement formed of n-doping of the layers of the semiconductor mirror in conjunction with a low n-doped metamorphic buffer leads to an increase in the photocurrent in the Ge subcell.

The tellurium n-doped layer of the first tunnel diode can be doped with at least $1 \cdot 10^{19}$ cm$^{-3}$ or at least $5 \cdot 10^{18}$ cm$^{-3}$.

The n-doped layer of the first tunnel diode can have less than 1% P.

The n-doped layer of the first tunnel diode can have less than 1% Al.

The p-doped layer of the first tunnel diode can contain at least the elements In, Ga, and As.

The thickness of the n-doped layer and also the thickness of the p-doped layer of the first tunnel diode can be at least 10 nm and at most 100 nm.

The p-doped layer of the first tunnel diode can be strained by at least 0.5% compared to the n-doped part. Stated differently, the lattice constant of the p-doped layer is at least 0.030 Å smaller than that of the n-doped layer.

The metamorphic buffer can have at least three semiconductor layers or exactly four or exactly five or exactly six or preferably seven or exactly eight or exactly nine layers. The overshoot layers can be formed as part of the metamorphic buffer.

The metamorphic buffer can have a lattice constant that changes gradually, e.g., in a step-like or ramp-like manner, from a first lattice constant value to a second lattice constant value.

At least two of the buffer layers of the metamorphic buffer can have a doping less than $5 \cdot 10^{17}$ cm$^{-3}$ or less than $3 \cdot 10^{17}$ cm$^{-3}$ or less than $1 \cdot 10^{17}$ cm$^{-3}$ or less than $7 \cdot 10^{16}$ cm$^{-3}$ or less than $4 \cdot 10^{16}$ cm$^{-3}$.

The semiconductor layers of the metamorphic buffer usually comprise or consist of InGaAs. The overshoot layer has or consists of AlInGaAs in order to increase the transparency for the underlying Ge cell.

It should be noted that the stoichiometry changes from layer to layer of the metamorphic buffer in order to change the lattice constant from layer to layer. The concentration of indium preferably changes from layer to layer in a range between 2% and 5%.

The layers of the metamorphic buffer differ by no more than a factor of 2 in the maximum level of the doping concentration.

The metamorphic buffer can comprise a second overshoot layer.

The layers of the semiconductor mirror can have a doping less than $1 \cdot 10^{19}$ cm$^{-3}$ or less than $5 \cdot 10^{18}$ cm$^{-3}$ or less than $3 \cdot 10^{18}$ cm$^{-3}$ or less than $1.5 \cdot 10^{18}$ cm$^{-3}$ or less than $8 \cdot 10^{17}$ cm$^{-3}$ or less than $5 \cdot 10^{17}$ cm$^{-3}$.

The semiconductor mirror and the layers of the metamorphic buffer can have silicon or tellurium as a dopant.

The layers of the semiconductor mirror with a lower refractive index can have a lower doping and/or a different dopant in contrast to the layers of the semiconductor mirror with a higher refractive index.

The layers of the semiconductor mirror with a lower refractive index can have a lower doping by at least a factor of 2 than the layers of the semiconductor mirror with a higher refractive index.

The layers of the semiconductor mirror with a lower refractive index can consist of AlInAs or comprise AlInAs. In an example, the layers of the semiconductor mirror with a lower refractive index do not have any gallium.

The layers of the semiconductor mirror can have a doping greater than $5 \cdot 10^{16}$ cm$^{-3}$ or greater than $1 \cdot 10^{17}$ cm$^{-3}$ or greater than $5 \cdot 10^{17}$ cm$^{-3}$.

At least two of the buffer layers or all buffer layers can have a doping lower than the doping of the layers of the semiconductor mirror.

The multi-junction solar cell can have a fifth subcell.

The second subcell can have InGaAs or consists of InGaAs.

The third subcell can have GaAs or AlInGaAs or InGaAsP or consists of GaAs or of AlInGaAs or InGaAsP.

The fourth subcell has AlInGaP or InAlP or consists of AlInGaP or of InAlP.

It is understood that, in addition to the materials mentioned, each solar cell additionally has dopants, e.g., tellurium or silicon, and possibly also impurities.

The multi-junction solar cell can have a fifth solar cell, wherein the fifth subcell is placed between the fourth subcell and the third subcell and has InGaP or consists of InGaP. In one refinement, the fifth subcell is formed on the fourth subcell.

The multi-junction solar cell can have exactly four subcells, wherein the fourth subcell has a band gap between 2.0 eV and 1.8 eV and the third subcell has a band gap between 1.4 eV and 1.6 eV and the second subcell has a band gap between 1 eV and 1.2 eV and the first subcell has a band gap between 0.6 eV and 0.7 eV.

Further, one or more of the subcells can be formed as hetero subcells. Here, the emitter and the base have a different composition of elements. It is understood, however, that the lattice constants of the emitter and base are the same in the respective subcells.

Further scope of applicability of the present invention will become apparent from the detailed description given hereinafter. However, it should be understood that the detailed description and specific examples, while indicating preferred embodiments of the invention, are given by way of illustration only, since various changes, combinations and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
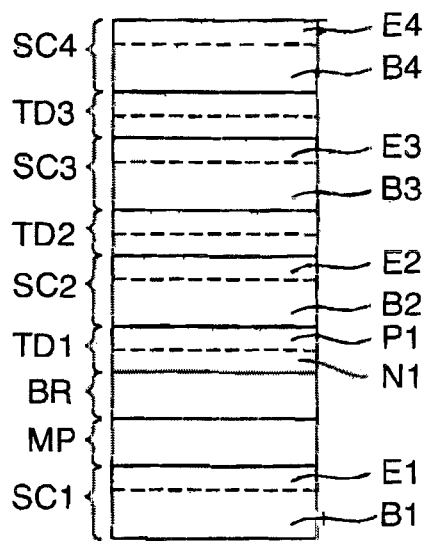
FIG. 1 shows a view of a stacked monolithic multi-junction solar cell.

The diagram in FIG. 1 shows a schematic cross section through a multi-junction solar cell with four monolithic subcells SC1, SC2, SC3, and SC4 arranged in a stack.

Each subcell has a p-doped base B1, B2, B3, or B4 and an n-doped emitter E1, E2, E3, or E4, wherein emitter E1 and base B1 of the first subcell SC1 have or consist of germanium and emitters E2, E3, and E4 and base B2, B3, B4 of subcells SC2, SC3, and SC4 following the first subcell SC1 each have at least one element of main group III and at least one element of main group V.

Each of the further subcells SC2, SC3, and SC4 is formed either as a homo subcell or as a hetero subcell.

Subcells SC1, SC2, SC3, and SC4 have band gaps that increase from subcell to subcell from first subcell SC1 in the direction of fourth subcell SC4.

Second, third, and fourth subcells SC2, SC3, and SC4 are made lattice-matched to one another, whereas first subcell SC1 has a lattice constant different from the lattice constant of the further subcells SC2, SC3, and SC4.

In order to compensate for the difference in the lattice constant, the stacked multi-junction solar cell additionally has a metamorphic buffer MP with lattice constants that change along a height of metamorphic buffer MP.

Metamorphic buffer MP is placed between a top side of first subcell SC1 and a bottom side of semiconductor mirror BR and is n-doped. The lattice constant of metamorphic buffer MP changes, for example, along the height in a ramp-like or step-like manner from a value corresponding to the lattice constants of first subcell SC1 to a value corresponding to the lattice constants of second subcell SC2 and has an overshoot layer, so that the lattice constant first increases from layer to layer and then decreases again to the value of the lattice constant of second subcell SC2.

Figure 2:
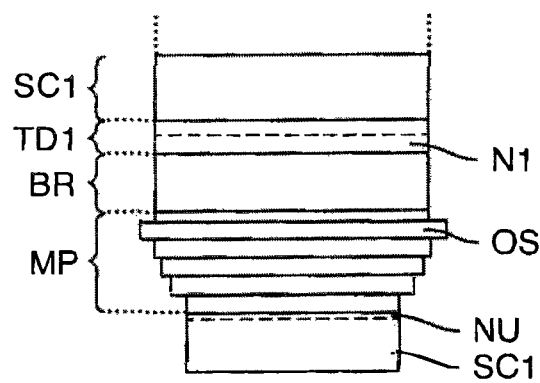
FIG. 2 shows a view of a stacked monolithic multi-junction solar cell.

Metamorphic buffer MP in FIG. 2 is n-doped and comprises at least four step layers and at least one overshoot layer. At least two of the buffer layers have a doping less than $8 \cdot 10^{17}$ cm$^{-3}$.

The difference in the doping of the metamorphic buffer layers from one another is preferably less than a factor of 2.

A semiconductor mirror BR adjacent to emitter E1 of first subcell SC1 is placed on a top side of first subcell SC1. Semiconductor mirror BR has a plurality of n-doped semiconductor layers with alternately different refractive indices and a dopant concentration in each case of at most $1 \cdot 10^{19}$ cm$^{-3}$ or at most $5 \cdot 10^{18}$ cm$^{-3}$.

A first tunnel diode TD1 with an n-doped layer N1 adjacent to the semiconductor mirror and with a p-doped layer P1 adjacent to second subcell SC2 is placed on a top side of semiconductor mirror BR and adjacent to base B2 of second subcell SC2.

Stated differently, the first tunnel diode TD1 is placed between the n-doped buffer MP and second subcell SC2. Furthermore, first tunnel diode TD1 has an InGaAs layer N1 n-doped with tellurium.

The n-doped layer N1 of first tunnel diode TD1 is placed below a p-doped layer P1. As a result, the n-doped layer N1 is preferably integrally connected to the topmost layer of semiconductor mirror BR.

With the embodiment of the n-doped layer N1 of the tunnel diode according to the invention, n-layer N1 or the entire first tunnel diode TD1 becomes very stable with respect to the thermal load due to the further growth of the III-V layers of subcells SC2, SC3, and SC4, in comparison, e.g., with an n-InAlP layer.

It should be noted that in contrast to the usual arrangement in which semiconductor mirror BR is placed directly below a subcell, e.g., directly below second subcell SC2, in the present case the semiconductor mirror BR is placed below first tunnel diode TD1.

Accordingly, in contrast to the usual p-doped design, semiconductor mirror BR is formed n-doped.

A second tunnel diode TD2 is placed between second subcell SC2 and third subcell SC3 and a third tunnel diode TD3 is placed between third subcell SC3 and fourth subcell SC4, each tunnel diode TD1, TD2, and TD3 having a p-n junction, therefore, an n-doped layer and a p-doped layer.

Figure 3:
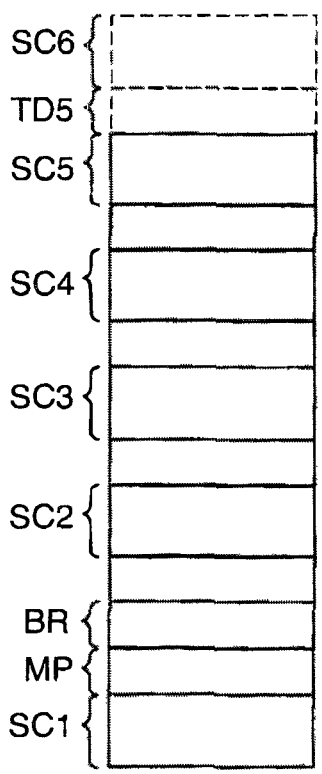
FIG. 3 shows a view of a stacked monolithic multi-junction solar cell

A further embodiment is shown in the diagram in FIG. 3. Only the differences from the diagram in FIG. 1 will be explained below.

The multi-junction solar cell is formed as a metamorphic five-junction solar cell, wherein the second, third, fourth, and fifth subcells SC2, SC3, SC4, and SC5 are made lattice-matched to one another, wherein first subcell SC1 has a lattice constant that differs from the lattice constant of the following subcells SC2, SC3, SC4, and SC5.

The difference in the lattice constants is compensated for by means of a metamorphic buffer MP placed between first subcell SC1 and semiconductor mirror BR.

In an embodiment that is not shown, the fifth subcell is placed between the fourth subcell and the third subcell and has InGaP or consists of InGaP.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A stacked monolithic multi-junction solar cell comprising:
    a first subcell;
    a second subcell on the first subcell;
    a third subcell on the second subcell;
    a fourth subcell on the third subcell, each of the first, second, third and fourth subcells comprising an n-doped emitter and a p-doped base;
    a first tunnel diode arranged between the first and second subcells;
    a second tunnel diode arranged between the second and third subcells;
    a third tunnel diode arranged between the third and fourth subcells, each of the first, second, and third tunnel diodes comprising a p-doped layer and an n-doped layer such that a p-n junction is formed;
    an n-doped semiconductor mirror having a plurality of doped semiconductor layers with alternately different refractive indices arranged between the first subcell and the second subcell; and
    an n-doped metamorphic buffer arranged between the first subcell and the semiconductor mirror, the metamorphic buffer comprising at least four step layers and at least one overshoot layer, a doping in the at least four step layers and at least one overshoot layer being below a value of $1 \cdot 10^{18}$ cm$^{-3}$, wherein the first tunnel diode is a metamorphic tunnel diode placed between the n-doped semiconductor mirror and the second subcell so that the metamorphic buffer, the semiconductor mirror, the first tunnel diode, and the second subcell are formed on the first subcell in that order, a lattice constant of the n-doped layer of the first tunnel diode being different from a lattice constant of the p-doped layer of the first tunnel diode, wherein first, second, third, and fourth band gaps are band gaps of the first, second, third, and fourth subcells, respectively, band gaps increasing from the first, second, third, and fourth band gaps in that order, wherein the emitter and the base of the first subcell each comprise germanium, wherein each of the second, third, and fourth subcells comprise at least one element of main group III and V of the periodic table, wherein the second, third, and fourth subcells are formed lattice-matched to one another, wherein the n-doped layer of the first tunnel diode comprises InGaAs, and wherein an In proportion of the n-doped layer of the first tunnel diode is at least 20%.

2. The stacked monolithic multi-junction solar cell according to claim 1, wherein the n-doped layer of the first tunnel diode is doped with at least $1 \cdot 10^{19}$ cm$^{-3}$.

3. The stacked monolithic multi-junction solar cell according to claim 1, wherein the n-doped layer of the first tunnel diode is doped with at least $5 \cdot 10^{18}$ cm$^{-3}$.

4. The stacked monolithic multi-junction solar cell according to claim 1, wherein the n-doped layer of the first tunnel diode comprises element P, which is less than 1%.

5. The stacked monolithic multi-junction solar cell according to claim 1, wherein the n-doped layer of the first tunnel diode comprises element Al, which is less than 1%.

6. The stacked monolithic multi-junction solar cell according to claim 1, wherein the p-doped layer of the first tunnel diode comprises at least the elements In, Ga, and As.

7. The stacked monolithic multi-junction solar cell according to claim 1, wherein both a thickness of the n-doped layer and a thickness of the p-doped layer of the first tunnel diode are at least 10 nm and at most 100 nm thick.

8. The stacked monolithic multi-junction solar cell according to claim 1, wherein the p-doped layer of the first tunnel diode is strained by at least 0.5% compared to the n-doped layer of the first tunnel diode or the lattice constant of the p-doped layer of the first tunnel diode is at least 0.030 Å smaller than that of the n-doped layer of the first tunnel diode.

9. The stacked monolithic multi-junction solar cell according to claim 1, wherein the n-doped layer of the first tunnel diode is doped with tellurium.

10. The stacked monolithic multi-junction solar cell according to claim 1, wherein the fourth subcell has a band gap between 2.0 eV and 1.8 eV and the third subcell has a band gap between 1.4 eV and 1.6 eV and the second subcell has a band gap between 1 eV and 1.2 eV and the first subcell has a band gap between 0.6 eV and 0.7 eV.

11. The stacked monolithic multi-junction solar cell according to claim 1, wherein at least two layers of the at least four step layers and the at least one overshoot layer of the metamorphic buffer have a doping less than $8 \cdot 10^{17}$ cm$^{-3}$.

12. The stacked monolithic multi-junction solar cell according to claim 1, wherein the plurality of doped semiconductor layers of the semiconductor mirror have a doping less than $1 \cdot 10^{19}$ cm$^{-3}$.

13. The stacked monolithic multi-junction solar cell according to claim 1, wherein the plurality of doped semiconductor layers of the semiconductor mirror have a doping greater than $5 \cdot 10^{18}$ cm$^{-3}$.

14. The multi-junction solar cell according to claim 10, wherein multi-junction solar cell comprises exactly the first, second, third, and fourth subcells.

15. The multi-junction solar cell according to claim 1, wherein at least one of the plurality of doped semiconductor layers of the semiconductor mirror with a lower refractive index has a lower doping and/or a different dopant than at least one of the plurality of semiconductor layers of the semiconductor mirror with a higher refractive index.

16. The multi-junction solar cell according to claim 1, wherein the plurality of doped semiconductor layers of the semiconductor mirror are all n-doped.

* * * * *